United States Patent
Mertke et al.

(10) Patent No.: US 12,467,130 B2
(45) Date of Patent: Nov. 11, 2025

(54) TEMPERATURE-TUNED SUBSTRATE SUPPORT FOR SUBSTRATE PROCESSING SYSTEMS

(71) Applicant: Lam Research Corporation, Fremont, CA (US)

(72) Inventors: Norman A. Mertke, San Jose, CA (US); Himanshu Chokshi, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 494 days.

(21) Appl. No.: 17/315,998

(22) Filed: May 10, 2021

(65) Prior Publication Data

US 2021/0265144 A1 Aug. 26, 2021

Related U.S. Application Data

(62) Division of application No. 15/593,987, filed on May 12, 2017, now Pat. No. 11,011,355.

(51) Int. Cl.
*C23C 14/54* (2006.01)
*C23C 16/458* (2006.01)
(Continued)

(52) U.S. Cl.
CPC ........ *C23C 14/541* (2013.01); *C23C 16/4586* (2013.01); *C23C 16/463* (2013.01);
(Continued)

(58) Field of Classification Search
CPC . C23C 14/541; C23C 16/4586; C23C 16/463; H01J 2237/2065
See application file for complete search history.

(56) References Cited

U.S. PATENT DOCUMENTS

| | | | | |
|---|---|---|---|---|
| 5,148,003 A | * | 9/1992 | Haj-Ali-Ahmadi | H01L 22/00 257/E21.511 |
| 5,273,588 A | * | 12/1993 | Foster | H01L 21/6838 118/715 |

(Continued)

FOREIGN PATENT DOCUMENTS

| | | |
|---|---|---|
| JP | 11-111823 A | 4/1999 |
| JP | 2003249541 A | 9/2003 |

(Continued)

OTHER PUBLICATIONS

International Search Report and Written Opinion dated Nov. 13, 2018 corresponding to International Application No. PCT/US2018/031996, 8 pages.

(Continued)

*Primary Examiner* — Keath T Chen

(57) ABSTRACT

A system for controlling a temperature of a substrate during treatment in a substrate processing system comprises a substrate support including first and second components, first and second heaters, and first and second heat sinks. The first component includes an upper surface at least partially defining a center zone. The second component is arranged radially outside of and below the first component. The second component includes an upper surface at least partially defining a radially-outer zone. The first and second components are spaced apart and define a gap between them. The first and second heaters are configured to heat the first and second components, respectively. The first heat sink has one end in thermal communication with the first component. The second heat sink has one end in thermal communication with the second component.

12 Claims, 9 Drawing Sheets

(51) Int. Cl.
*C23C 16/46* (2006.01)
*H01J 37/32* (2006.01)

(52) U.S. Cl.
CPC .. *H01J 37/32697* (2013.01); *H01J 37/32724* (2013.01); *H01J 2237/2065* (2013.01); *H01J 2237/335* (2013.01)

(56) References Cited

U.S. PATENT DOCUMENTS

| | | | |
|---|---|---|---|
| 5,595,241 | A | 1/1997 | Jelinek |
| 5,683,072 | A * | 11/1997 | Ohmi ................ C23C 8/14 |
| | | | 251/193 |
| 6,081,414 | A | 6/2000 | Flanigan et al. |
| 6,091,889 | A * | 7/2000 | Hwu ............. H01L 21/67115 |
| | | | 219/390 |
| 6,214,121 | B1 | 4/2001 | Cho et al. |
| 6,705,394 | B1 | 3/2004 | Moslehi et al. |
| 7,161,121 | B1 | 1/2007 | Steger |
| 7,941,039 | B1 * | 5/2011 | Shrinivasan ...... H01L 21/67115 |
| | | | 118/724 |
| 8,894,806 | B2 | 11/2014 | Koshimizu et al. |
| 10,699,935 | B2 | 6/2020 | Himori et al. |
| 2002/0076490 | A1 * | 6/2002 | Chiang ............ H01J 37/32449 |
| | | | 257/E21.171 |
| 2004/0045813 | A1 | 3/2004 | Kanno et al. |
| 2005/0072716 | A1 * | 4/2005 | Quiles ............. H01L 21/67017 |
| | | | 206/725 |
| 2006/0243385 | A1 * | 11/2006 | Kudella ........... H01L 21/67109 |
| | | | 156/307.3 |
| 2006/0291132 | A1 | 12/2006 | Kanno et al. |
| 2007/0251456 | A1 | 11/2007 | Herchen et al. |
| 2008/0131605 | A1 * | 6/2008 | Nasu ..................... H01L 21/324 |
| | | | 427/314 |
| 2009/0159566 | A1 | 6/2009 | Brillhart et al. |
| 2010/0039747 | A1 | 2/2010 | Sansoni et al. |
| 2010/0243606 | A1 | 9/2010 | Koshimizu et al. |
| 2012/0196242 | A1 | 8/2012 | Volfovski et al. |
| 2012/0227666 | A1 * | 9/2012 | Kim ................. H01L 21/67309 |
| | | | 414/800 |
| 2012/0264051 | A1 | 10/2012 | Angelov et al. |
| 2014/0021673 | A1 | 1/2014 | Chen et al. |
| 2014/0213055 | A1 | 7/2014 | Himori et al. |
| 2015/0036259 | A1 * | 2/2015 | Cox .................... H01L 21/6833 |
| | | | 361/234 |
| 2015/0187626 | A1 | 7/2015 | Parkhe et al. |
| 2016/0002779 | A1 | 1/2016 | Lin et al. |
| 2016/0343600 | A1 | 11/2016 | Parkhe |
| 2017/0040190 | A1 | 2/2017 | Benjaminson et al. |
| 2017/0110298 | A1 | 4/2017 | Ricci et al. |
| 2017/0162423 | A1 * | 6/2017 | Bernier ............. H01L 21/67294 |

FOREIGN PATENT DOCUMENTS

| | | |
|---|---|---|
| JP | 3881908 B2 | 2/2007 |
| JP | 2010157776 A | 7/2010 |
| JP | 2010251723 A | 11/2010 |
| JP | 201144732 A | 3/2011 |
| JP | 201342012 A | 2/2013 |
| JP | 2014072355 A | 4/2014 |
| JP | 2014534614 A | 12/2014 |
| JP | 2016526303 A | 9/2016 |
| JP | 2016207979 A | 12/2016 |
| KR | 20040035281 A | 4/2004 |
| KR | 20050000852 A | 1/2005 |
| KR | 20170040191 A | 4/2017 |
| WO | WO-2006090730 A1 | 8/2006 |

OTHER PUBLICATIONS

Japanese Office Action for corresponding Japanese Application No. 2019-560734 mailed Jul. 5, 2022.
Chinese Office Action for corresponding Chinese Application No. 201880031182.5 mailed Mar. 21, 2023.
Japanese Office Action for corresponding Japanese Application No. 2019-560734 mailed Apr. 11, 2023.
Korean Office Action for corresponding Korean Application No. 10-2019-7036674 mailed Apr. 5, 2023.

* cited by examiner

TEMPERATURE-TUNED SUBSTRATE SUPPORT FOR SUBSTRATE PROCESSING SYSTEMS

CROSS-REFERENCE TO RELATED APPLICATIONS

The present disclosure is a divisional of U.S. patent application Ser. No. 15/593,987 filed on May 12, 2017. The entire disclosure of the application referenced above is incorporated herein by reference.

FIELD

The present disclosure relates to substrate processing systems, and more particularly to a temperature-tuned substrate support for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During processing of substrates such as semiconductor wafers, one or more film layers are deposited on the substrates. After deposition, the layers may be patterned and etched. During patterning, a photoresist or hard mask layer may be used to protect selected portions of underlying layers. After processing, the photoresist or hard mask layer is removed using a stripping process.

SUMMARY

A system for controlling a temperature of a substrate during treatment in a substrate processing system includes a substrate support defining a center zone and a radially-outer zone. The substrate is arranged over both the center zone and the radially-outer zone during treatment. A first heater is configured to heat the center zone. A second heater is configured to heat the radially-outer zone. A first heat sink has one end in thermal communication with the center zone. A second heat sink has one end in thermal communication with the radially-outer zone. A temperature difference between the center zone and the radially-outer zone is greater than 10° C. during the treatment.

In other features, the substrate is held by gravity on the substrate support and is not held by mechanical clamping or an electrostatic chuck. The substrate support includes a first component including a center portion having a first thickness and a radially-projecting portion having a second thickness that is less than the first thickness. A second component is arranged below and radially outside of the first component and includes an annular portion and an axially-projecting portion that is connected to the annular portion of the second component and to a radially-outer edge of the radially-projecting portion of the first component.

In other features, a first gap is defined in an axial direction between the center portion of the first component and the annular portion of the second component. A second gap is defined between a radially-outer surface of the center portion and a radially-inner surface of the axially projection portion. An upper surface of the center portion at least partially defines the center zone. An upper surface of the axially-projecting portion at least partially defines the radially-outer zone.

In other features, the second component includes a plurality of bores. The first heat sink includes a plurality of projections connected to the first component and passing through the plurality of bores.

In other features, the substrate support includes a first component including an upper surface at least partially defining the center zone. A second component is arranged radially outside of and below the first component. The first component and the second component are spaced apart and define a gap therebetween. The second component includes an upper surface at least partially defining the radially-outer zone.

In other features, the first component has a cone shape and the second component has an inverse cone shape. A plurality of spacers is arranged in the substrate support to provide a predetermined gap between the substrate and the substrate support during treatment. The second heat sink comprises a bellows heat sink. The substrate support includes a plurality of notches that are defined in the center zone and the radially-outer zone and that extend radially inwardly from an outer edge of the substrate support.

In other features, a temperature-controlled thermal mass is in thermal communication with opposite ends of the first heat sink and the second heat sink.

In other features, at least one of the center zone and the radially-outer zone is maintained at a temperature in a range from 90° C. to 350° C. The temperature difference is in a range from 18° C. to 100° C. In other features, the treatment comprises photoresist ashing, at least one of the center zone and the radially-outer zone is maintained at a temperature in a range from 90° C. to 350° C. The temperature difference is in a range from 18° C. to 100° C.

A system for controlling a temperature of a substrate during treatment in a substrate processing system includes a substrate support including a first component including a center portion having a first thickness and partially defining a center zone; and a radially-projecting portion having a second thickness that is greater than the first thickness. A second component is arranged below and radially outside of the first component and includes an annular portion. An axially-projecting portion is connected to the annular portion of the second component and a radially-outer edge of the radially-projecting portion of the first component and partially defines a radially-outer zone. The substrate is arranged over both the center zone and the radially-outer zone during treatment. A first heater is configured to heat the first component. A second heater is configured to heat the second component. A first heat sink has one end in thermal communication with the first component. A second heat sink has one end in thermal communication with the second component. A temperature difference between the first component and the second component is in a range from than 10° C. to 100° C. during the treatment.

In other features, the substrate is held by gravity on the substrate support and is not held by mechanical clamping or an electrostatic chuck. An upper surface of the center portion corresponds to the center zone. An upper surface of the axially-projecting portion corresponds to the radially-outer zone.

In other features, the second component includes a plurality of bores. The first heat sink includes a plurality of projections connected to the first component and passing through the plurality of bores.

In other features, a plurality of spacers arranged in the center zone provide a predetermined gap between the substrate and the substrate support during treatment. The substrate support includes a plurality of notches projecting radially inwardly from an outer edge of the substrate support.

In other features, a temperature-controlled thermal mass is in thermal communication with opposite ends of the first heat sink and the second heat sink. At least one of the center zone and the radially-outer zone is maintained at a temperature in a range from 90° C. to 350° C. The temperature difference is in a range from 18° C. to 100° C.

In other features, the treatment comprises photoresist ashing. At least one of the center zone and the radially-outer zone is maintained at a temperature in a range from 90° C. to 350° C. The temperature difference is in a range from 18° C. to 100° C. The substrate is held by gravity on the substrate support and is not held by mechanical clamping or an electrostatic chuck.

A system for controlling a temperature of a substrate during treatment in a substrate processing system includes a substrate support including a first component including an upper surface at least partially defining a center zone. A second component is arranged radially outside of and below the first component. The first component and the second component are spaced apart and define a gap therebetween. The second component includes an upper surface at least partially defining a radially-outer zone. A first heater is configured to heat the first component. A second heater configured to heat the second component. A first heat sink has one end in thermal communication with the first component. A second heat sink has one end in thermal communication with the second component. A temperature difference between the first component and the second component is in a range from than 10° C. to 100° C. during the treatment.

In other features, the substrate is held by gravity on the substrate support and is not held by mechanical clamping or an electrostatic chuck. The first component has a cone shape and the second component has an inverse cone shape. The second heat sink includes a bellows-type heat sink.

A plurality of spacers arranged in the center zone provide a predetermined gap between the substrate and the substrate support during treatment. The substrate support includes a plurality of notches projecting radially inwardly from an outer edge of the substrate support.

In other features, a temperature-controlled thermal mass is in thermal communication with opposite ends of the first heat sink and the second heat sink. At least one of the center zone and the radially-outer zone is maintained at a temperature in a range from 90° C. to 350° C. The temperature difference is in a range from 18° C. to 100° C.

In other features, the treatment comprises photoresist ashing. At least one of the center zone and the radially-outer zone is maintained at a temperature in a range from 90° C. to 350° C. The temperature difference is in a range from 18° C. to 100° C.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
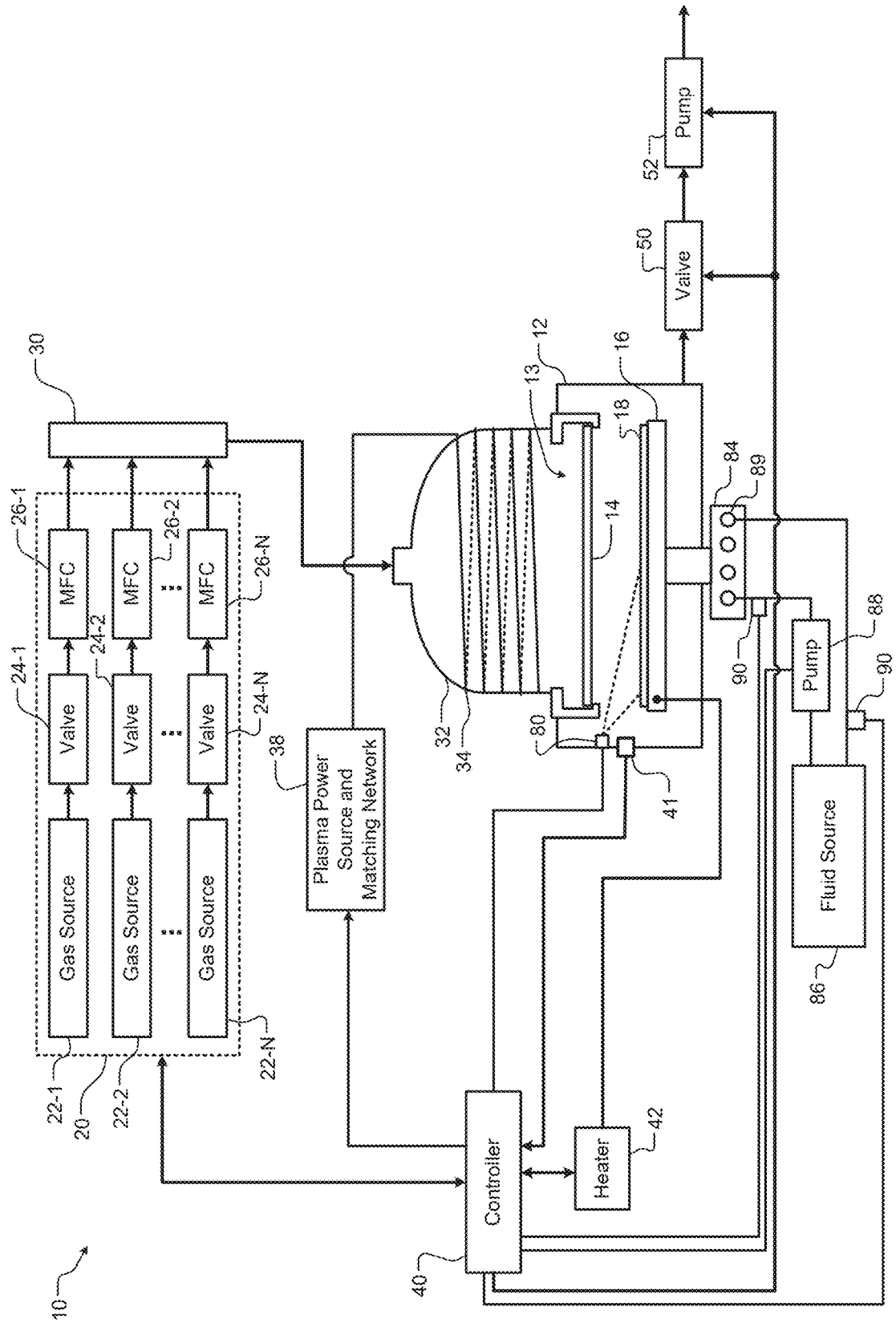
FIG. 1 is a functional block diagram of an example of a substrate processing system according to the present disclosure.

In some photoresist strip processes, the photoresist layer has a non-uniform thickness. In other words, the photoresist layer is thicker (or thinner) at the edge of the substrate and thinner (or thicker) at the center of the substrate. Photoresist thickness can also vary from substrate to substrate or batch to batch. While the photoresist layer can be stripped using a uniform wafer temperature, the strip process would need to run long enough to completely remove the thicker photoresist at the edge (or center). However, the center (or edge) of the wafer is over-etched, which may cause damage to underlying layers.

In other examples, the photoresist strip process that is used may have an ash rate that is non-uniform from center to edge. In other words, even when the photoresist layer has a uniform thickness from center to edge, the photoresist strip process may remove more (or less) at the center as compared to the edge.

Photoresist strip rates typically depend strongly on temperature. Systems and methods according to the present disclosure compensate for thickness non-uniformity of the photoresist layer and/or ash rate non-uniformity of the process by creating a non-uniform wafer temperature profile using a temperature-tuned substrate support. In some examples, a temperature differential in a range from 10° C. to 100° C. is created between the center and the edge to create different ash rates that can vary by greater than +/−10%, 20% or more. In some examples, a temperature differential in a range from 18° C. to 100° C. is created between the center and the edge to create different ash rates that can vary by greater than +/−10%, 20% or more. In some examples, a temperature differential in a range from 25° C. to 100° C. is created between the center and the edge to create different ash rates that can vary by greater than +/−10%, 20% or more.

In some examples, the substrate support may be made of a material such as aluminum, which has high thermal conductivity. Therefore, creating a non-uniform temperature is problematic. In some examples, the substrate is held by gravity and is not mechanically clamped or held by an electrostatic chuck. Further, gas pressure in the processing chamber may be relatively low (for example, in a range from 1 to 2 Torr). As a result, the gas transfer medium has low thermal conductivity. These conditions mean that the temperature of the substrate is much lower than the temperature of the substrate support. Therefore, to create the desired temperature non-uniformity on the substrate to compensate for the photoresist thickness variation, a very large variation in temperature across the substrate support is required.

In some examples, the settings for the temperature non-uniformity are used for a batch of substrates. In other examples, the settings for the temperature non-uniformity are set for individual substrates based on a measured photoresist thickness profile of an incoming substrate. For example, the thickness of the photoresist layer can be measured using an in-situ and non-contact, optical interference measurement prior to the delivery of the substrate to the chamber, when the substrate enters the processing chamber, or when the substrate is in the chamber, although other methods for measuring the thickness of the photoresist layer can be used.

The systems and methods according to the present disclosure provide two independently controlled zones, a center zone and a radially-outer zone, to drive a thermal gradient in the substrate from center to edge. The systems and methods provide center to edge process tune-ability. In a first example, the substrate support provides a uniform surface for the substrate and drives a thermal gradient across a relatively thin section between the center and radially-outer zones. In another example, the center and radially-outer zones are separated by a gap to create a larger temperature difference between the center and radially-outer zones and to drive a larger thermal gradient in the substrate. In both examples, each zone may be provided with a heat sink to allow accurate temperature control. In some examples, both of the heat sinks are in thermal communication with a temperature-controlled thermal mass.

Referring now to FIG. 1, an example of a substrate processing system 10 is shown. While a specific processing chamber is shown, other types of chambers can be used. The substrate processing system 10 includes a lower chamber 12 and a gas distribution device 13 such as a faceplate or showerhead 14 including spaced through holes. A substrate support 16 may be arranged in the lower chamber 12. During use, a substrate 18 such as a semiconductor wafer or other type of substrate is arranged on the substrate support 16.

The substrate processing system 10 includes a gas delivery system 20 to supply gas mixtures (such as photoresist stripping process gases) and/or purge gas. For example only, the gas delivery system 20 may include one or more gas sources 22-1, 22-2, ..., and 22-N (collectively gas sources 22) where N is an integer greater than zero, valves 24-1, 24-2, ..., and 24-N (collectively valves 24), and mass flow controllers (MFC) 26-1, 26-2, ..., and 26-N (collectively MFC 26).

Outputs of the gas delivery system 20 may be mixed in a manifold 30 and delivered to an upper chamber 32 arranged above the gas distribution device 13. In some examples, the upper chamber 32 is domed. A plasma source includes an inductive coil 34 arranged around the upper chamber 32. A plasma power source and matching network 38 selectively supplies radio frequency (RF) or microwave (MW) plasma power to the inductive coil 34. While an inductively coupled plasma (ICP) system is shown, other types of plasma generation may be used. For example, a remote plasma source may be used. Alternately, the plasma may be generated directly in the processing chamber. For example only, a capacitively coupled plasma (CCP) system or any other suitable type of plasma system may be used. In still other examples, the processing chamber performs deposition or etching without plasma.

A controller 40 may be connected to one or more sensors 41 that monitor operating parameters in the processing chamber such as temperature, pressure, etc. Two or more heaters 42 may be provided to heat two or more zones of the substrate support 16 and the substrate 18 to desired process temperatures. The heaters 42 may include resistive heaters, fluid channels, thermo-electric devices, etc. In some examples, the heaters 42 include two or more zones that are independently controllable by the controller 40. In some examples, the heaters 42 independently control heat to two or more zones.

The controller 40 controls an optional valve 50 and pump 52 to control pressure and to evacuate gas from the processing chamber. In some examples, the pump 52 is a turbomolecular pump. In some examples, the pressure in the chamber is maintained in a range from 0.5 Torr to 3 Torr. In some examples, the pressure in the chamber is maintained in a range from 1 Torr to 2 Torr. The controller 40 may be used to control the gas delivery system 20, the heaters 42, the valve 50, the pump 52, and plasma generated by the plasma source.

In some examples, the controller 40 is configured to supply a gas mixture having a predetermined ratio of gases to the processing chamber. If plasma is used, the controller 40 is also configured to supply plasma from a remote plasma source or strike plasma in the processing chamber.

One or more sensors 80 such as optical interference sensors may be used to measure thicknesses of an outer layer of the substrate (such as a photoresist layer) at various radial distances from a center of the substrate. The sensors 80 can perform the measurement in-situ in the processing chamber, before or as the substrate enters the chamber, or at another station. The thickness measurements can be output to the controller 40. In some examples, the controller 40 varies outputs of the heaters 42 to the center zone and the radially outer zone to effectuate a desired temperature gradient (increasing or decreasing temperature from center to edge) based on the different thicknesses measured by the sensors 80.

In some examples, a temperature-controlled thermal mass 84 is in thermal communication with one or more heat sinks (described below). The temperature-controlled thermal mass 84 is in fluid communication with a fluid source 86 such as a liquid source. A pump 88 may be used to control flow of fluid to channels 89 in the temperature-controlled thermal mass 84. Temperature sensors 90 may be used to sense a temperature of the fluid and/or the temperature-controlled thermal mass 84. In some examples, the temperature-controlled thermal mass 84 includes a block of aluminum.

Figure 2:
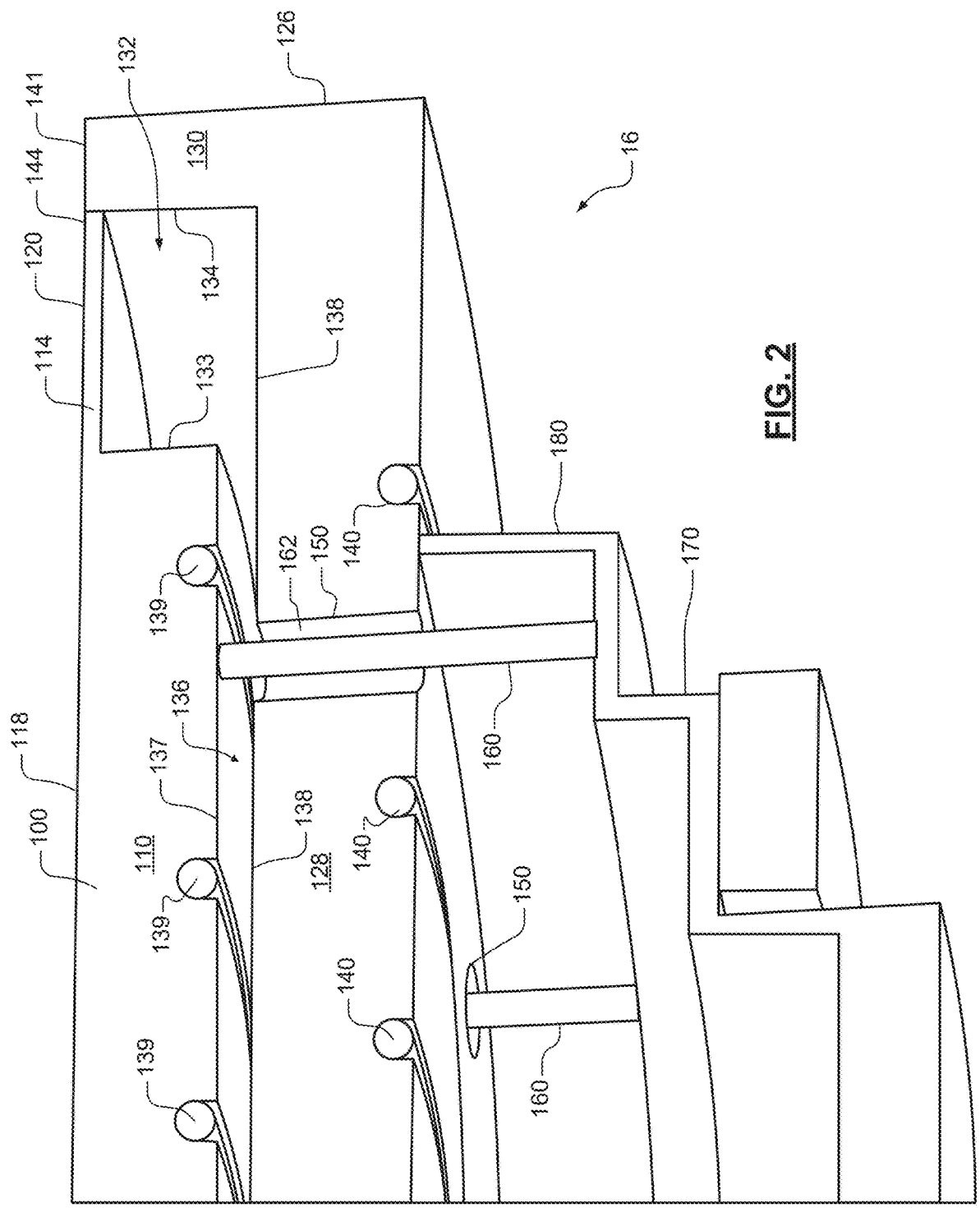
FIG. 2 is a cross-sectional view of an example of the substrate support of FIG. 1 according to the present disclosure.

Referring now to FIG. 2, the substrate support 16 is shown to include a first component 100 having a center cylindrical portion 110 and an annular radially-projecting portion 114. The center cylindrical portion 110 and the annular radially-projecting portion 114 of the first component 100 define upper surfaces 118, 120 that are generally coplanar. The substrate 18 is arranged on the upper surfaces 118, 120 during processing. A thickness of the center cylindrical portion 110 in an axial direction is greater than a thickness of the annular radially-projecting portion 114. In some examples, the thickness of the center cylindrical portion 110 of the first component 100 is greater than 2 or 4 times the thickness of the annular radially-projecting portion 114 of the first component 100.

A second component 126 includes a center cylindrical portion 128 and an annular axially-projecting portion 130. A gap 132 is created in a radial direction between a radially-outer surface 133 of the center cylindrical portion 110 and a radially-inner surface 134 of the annular axially-projecting portion 130 and between a lower surface of the radially-projecting portion and the upper surface of the second component. In some examples, the gap 132 has an annular shape. A gap 136 is defined between a lower surface 137 of the first component 100 and an upper surface 138 of the second component 126. In some examples, the gap 136 is generally constant in a radial direction.

Heaters 139, 140 are used to separately control heating of the first and second components 100 and 126, respectively. An end 141 of the annular axially-projecting portion 130 may be attached to an end 144 of the annular radially-projecting portion 114 of the first component 100. In some examples, the end 141 of the annular axially-projecting portion 130 is welded to the end 144 of the annular radially-projecting portion 114 of the first component 100. In some examples, electron beam welding is used.

The second component 126 includes a plurality of spaced bores 150. A plurality of projecting portions 160 act as a first heat sink and are connected to or extend from the lower surface 137 of the first component 100. The plurality of projecting portions 160 extend through the plurality of spaced bores 150 formed in the second component 126 and are connected to a heat sink structure 170 arranged below the second component 126. A gap 162 is formed between the plurality of projecting portions 160 and the plurality of spaced bores 150.

A second heat sink 180 connects the second component 126 to the heat sink structure 170. In some examples, the heat sink structure 170 may be thermally connected to the temperature-controlled thermal mass 84. Since the substrate and the substrate support may be heated by plasma, a size and/or configuration of the heat sinks and the temperature-controlled thermal mass 84 are determined in part by a lowest desired process temperature for the substrate during processing.

Figure 3:
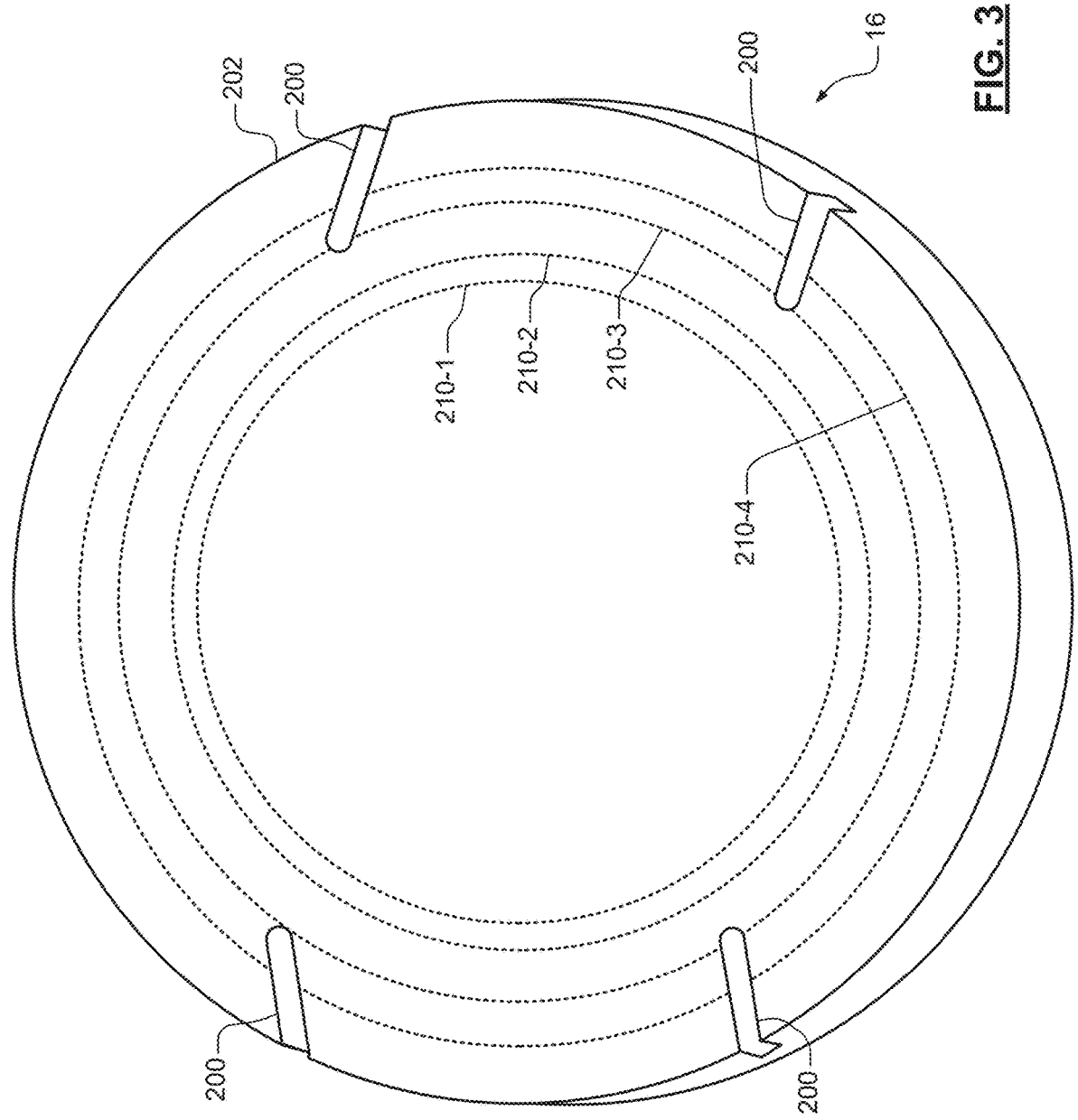
FIG. 3 is a plan view of the substrate support of FIG. 2.

Referring now to FIG. 3, the substrate support 16 may include a plurality of notches 200 (or fingers) that extend inwardly from a radially-outer edge 202 of the substrate support. The notches 200 provide clearance to allow the substrate 18 to be placed and picked from the substrate support 16. In operation, a temperature of the substrate support 16 produces a temperature gradient. In other words, different temperatures are provided between concentric temperature rings 210-1, 210-2, 210-3, 210-4. A temperature difference can be provided between portions of the substrate support 16 located inside the temperature ring 210-1 and portions outside of the temperature ring 210-4. The temperature difference is defined between the temperature ring 210-1 and the temperature ring 210-4. In some examples, the temperature difference is greater than 10° C., 18° C., 25° C. or another value up to 100° C.

During operation, when the first component 100 is at a higher temperature than the second component 126, heat flows from the first component 100 through the plurality of projecting portions 160 to the heat sink structure 170. Heat also flows from the first component 100 through the annular radially-projecting portion 114 to the axially-projecting portion 130 of the second component 126. As a result of the air gap 132 and the smaller relative thickness of the annular radially-projecting portion 114, the annular radially-projecting portion 114 exhibits a temperature gradient from a temperature of the first component 100 to the temperature of the second component 126. Heat flows in the opposite direction when the first component 100 is at a lower temperature than the second component 126.

Figure 4:
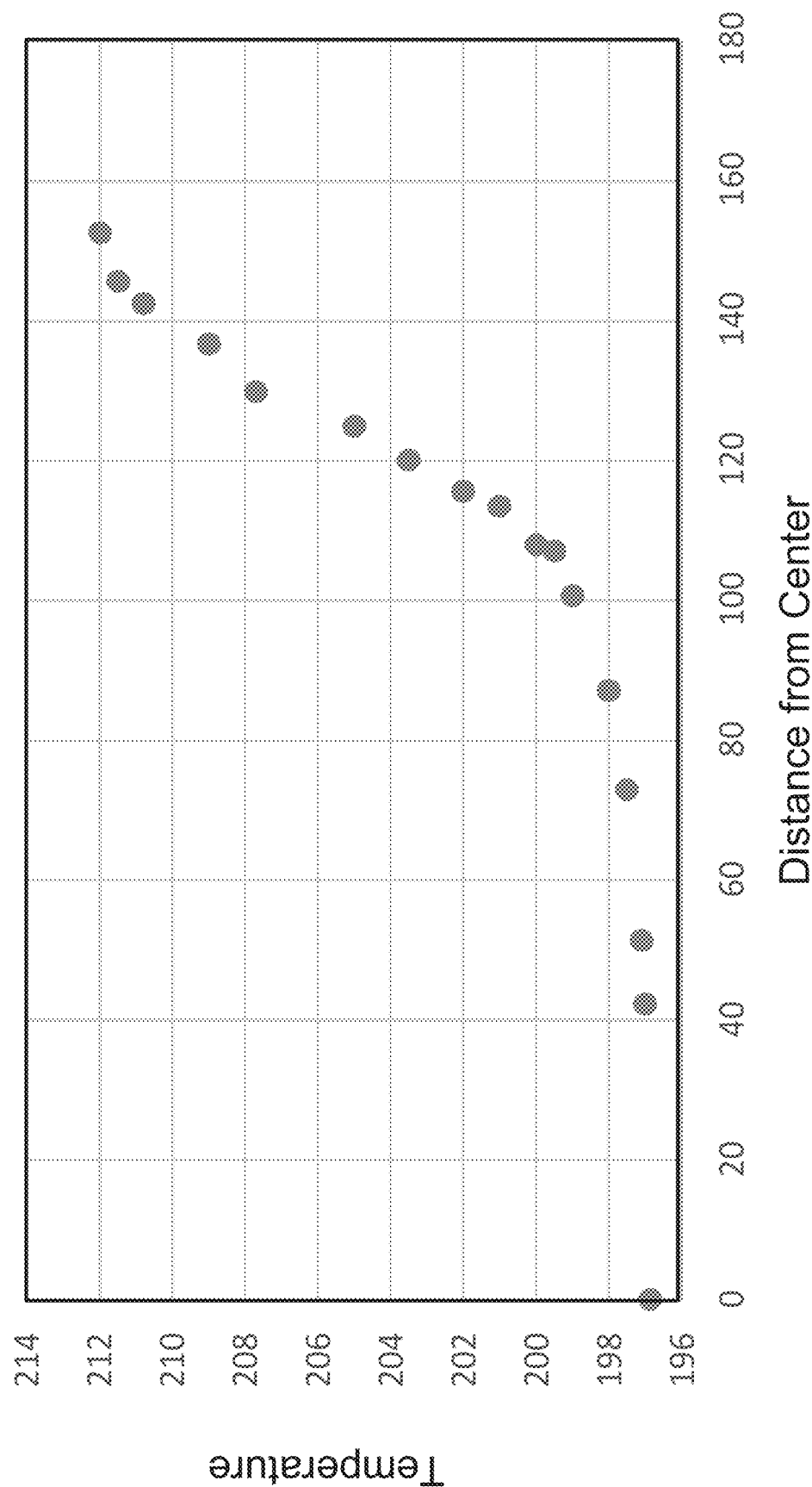
FIGS. 4 and 5 are graphs illustrating examples of temperature variation as a function of distance from a center of the substrate.
Figure 5:
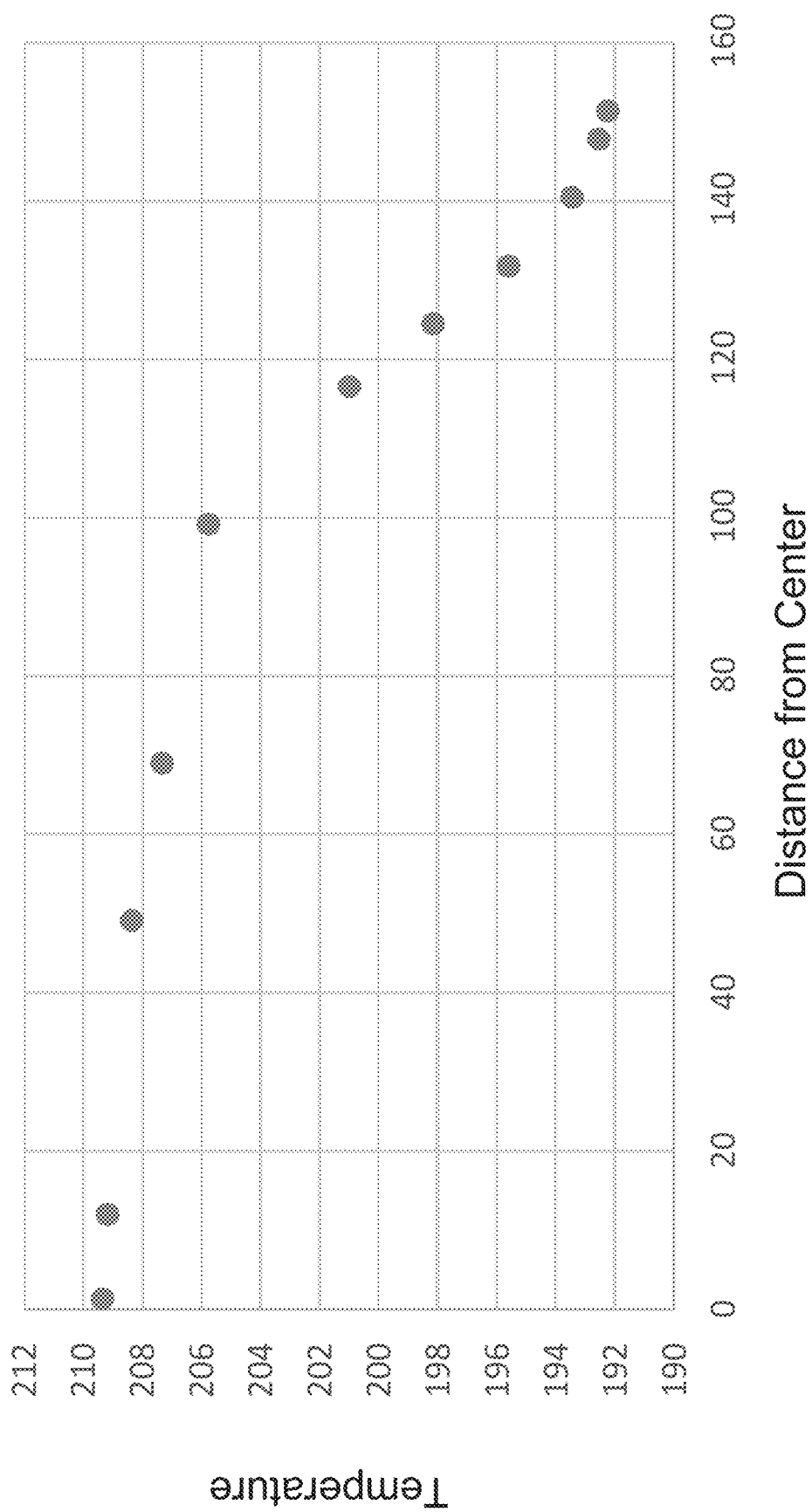

Referring now to FIGS. 4-5, an example of temperature variation is shown as a function of the distance from a center portion of the substrate. In FIG. 4, the temperature increases from a center temperature to an edge temperature. In FIG. 5, the temperature decreases from a center temperature to an edge temperature.

Figure 6:
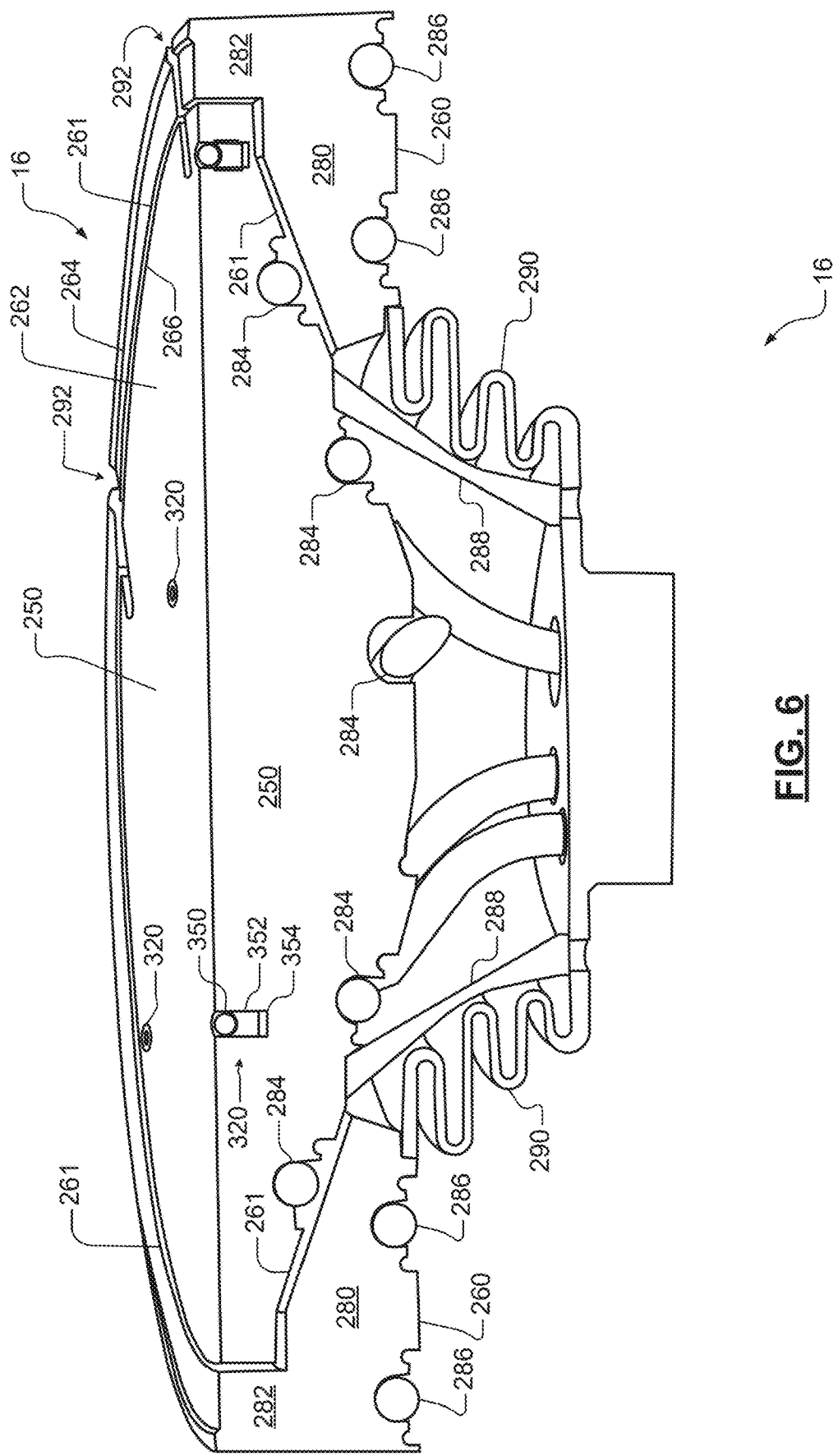
FIGS. 6 and 7 are cross-sectional views of another example of the substrate support of FIG. 1 according to the present disclosure.
Figure 7:
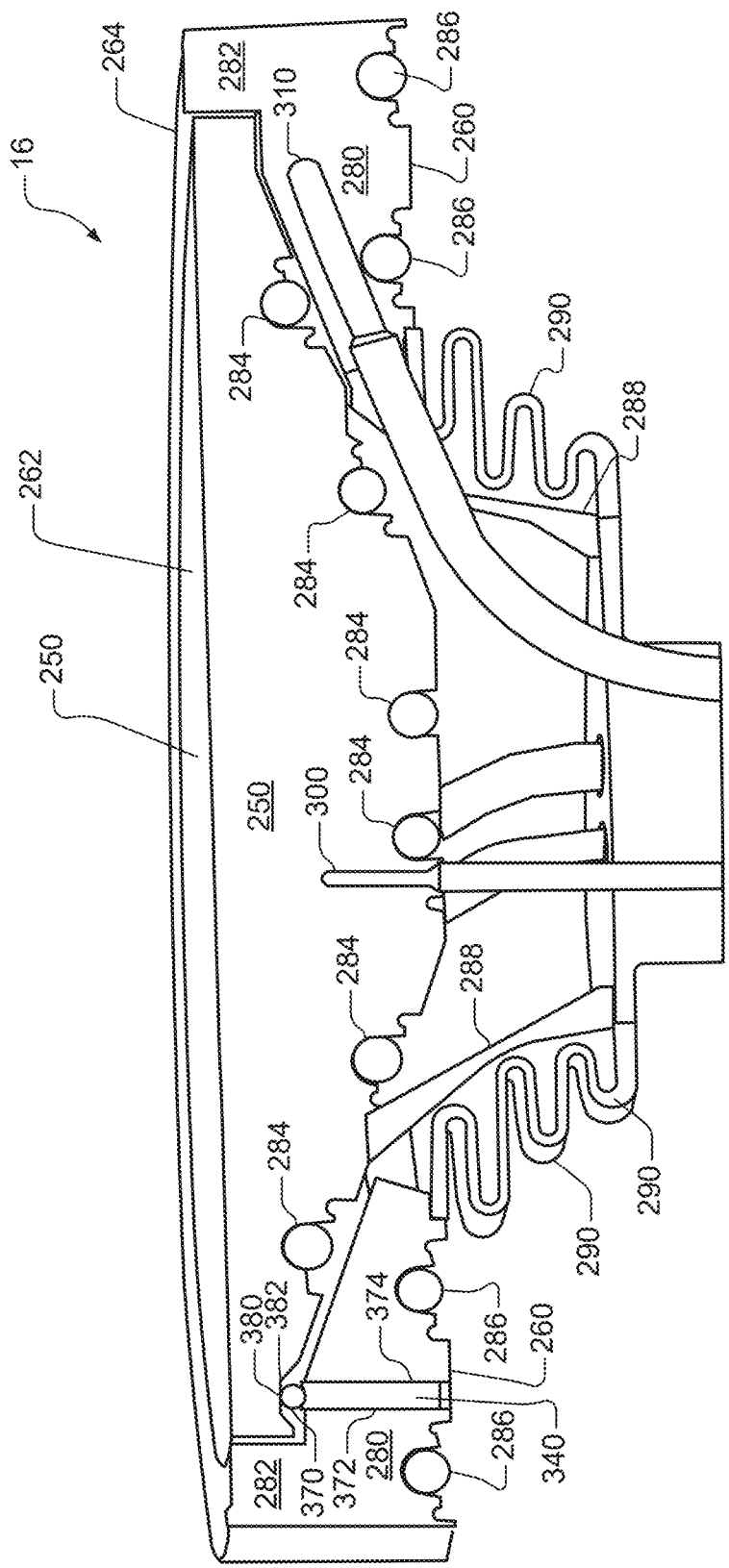

Referring now to FIGS. 6-7, a substrate support 16 includes a center component 250 and an outer component 260. A gap 261 is defined between the center component 250 and the outer component 260. Heating of the center component 250 and the outer component 260 is varied. In some examples, separate heat sinks are connected to the center component 250 and the outer component 260

Upper surfaces 262 and 264 of the center component 250 and the outer component 260 define a surface for receiving the substrate 18. In some examples, the center component 250 has a generally cone-shaped lower surface and the outer component 260 has an upper surface that is inverse cone-shaped to provide a complementary fit. The outer component 260 includes a lower portion 280 that extends radially inward and an upper portion 282 that extends axially upward. The upper portion 282 is arranged around a radially-outer edge 266 of the center component 250.

Heating coils 284 and 286 are arranged in thermal contact with the center component 250 and the outer component 260 to allow individual control of the temperature of the center component 250 and the outer component 260, respectively. A first heat sink 288 is arranged below the center component 250 and the outer component 260 and includes one end in thermal contact with the center component 250. A second heat sink 290 is arranged below the center component 250 and the outer component 260 and includes one end in thermal contact with the outer component 260. In some examples, the heat sink 290 is a bellows-type heat sink, although other types of heat sinks may be used. The center component 250 and the outer component 260 may include notches 292 as previously described above to allow the substrate to be placed and picked.

In FIG. 7, first and second thermocouples 300 and 310 may be used to monitor temperatures of the center component 250 and the outer component 260, respectively.

In FIG. 6, a plurality of height adjustment mechanisms 320 may be arranged on the upper surface 262 and may be used to adjust a height of the substrate 18 relative to the upper surface of the substrate support 16. In some examples, the height adjustment mechanisms 320 set a height of the substrate in a range from 0.003" to 0.01" above the upper surface of the substrate support 16. In some examples, the height of the substrate is maintained at 0.006" above the upper surface of the substrate support. In some examples, the plurality of height adjustment mechanisms 320 includes three or more height adjustment mechanisms arranged in spaced locations around a periphery of the center component 250 to support the substrate 18. As can be appreciated, the height adjustment mechanisms 320 allow adjustment of a gap which alters the amount of heat coupling from the substrate support 16 to the substrate 18. In some examples, the height adjustment mechanisms 320 include a ball 350 and a height adjustment device 352 arranged in a cavity 354 formed in the upper surface of the center component 250. The ball 350 provides a reduced contact area with a bottom-facing surface of the substrate.

In FIG. 7, a plurality of height adjustment mechanisms 340 may be provided to adjust a height of the center component 250 relative to the outer component 260. In some examples, the plurality of height adjustment mechanisms 340 includes three or more height adjustment mechanisms 340 arranged in spaced locations. As can be appreciated, the height adjustment mechanisms 340 allow adjustment of the gap, which alters the amount of heat coupling between the center component 250 and the outer component 260.

In some examples, the height adjustment mechanism 340 includes a ball 370 and a height adjustment device 372 arranged in a cavity 374 formed in the outer component 260. In some examples, the ball 370 is received by a slot 380 in a bottom surface 382 of the center component 250. In some examples, the ball 370 is made of sapphire, although other materials may be used.

In some examples, the substrate support 16 defines a temperature difference in a range from 10° C. to 100° C. between the center zone and the radially-outer zone. In some examples, the substrate support 16 defines a temperature difference in a range from 18° C. to 100° C. between the center zone and the radially-outer zone. In some examples, the ash rate varies +/−10% between t the center zone and the radially-outer zone. In other examples, the ash rate varies +/−20% between the center zone and the radially-outer zone. In some examples, the substrate support 16 is maintained at a temperature in a range from 90° C. to 350° C.

Figure 8A:
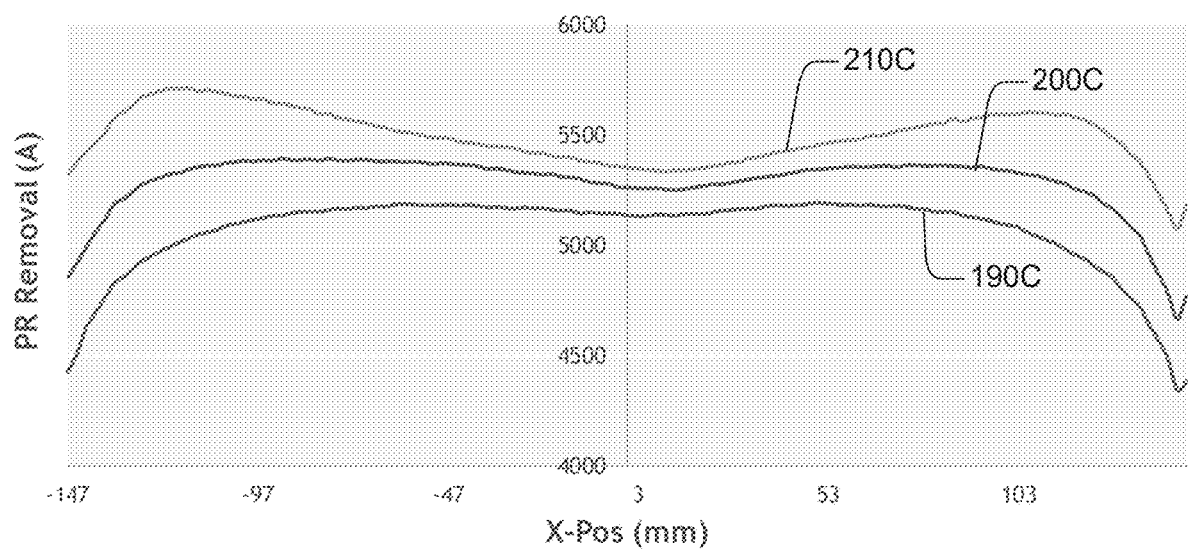
FIGS. 8A and 8B are graphs illustrating photoresist removal as a function of a distance from center of the substrate for different processing temperatures according to the present disclosure.
Figure 8B:
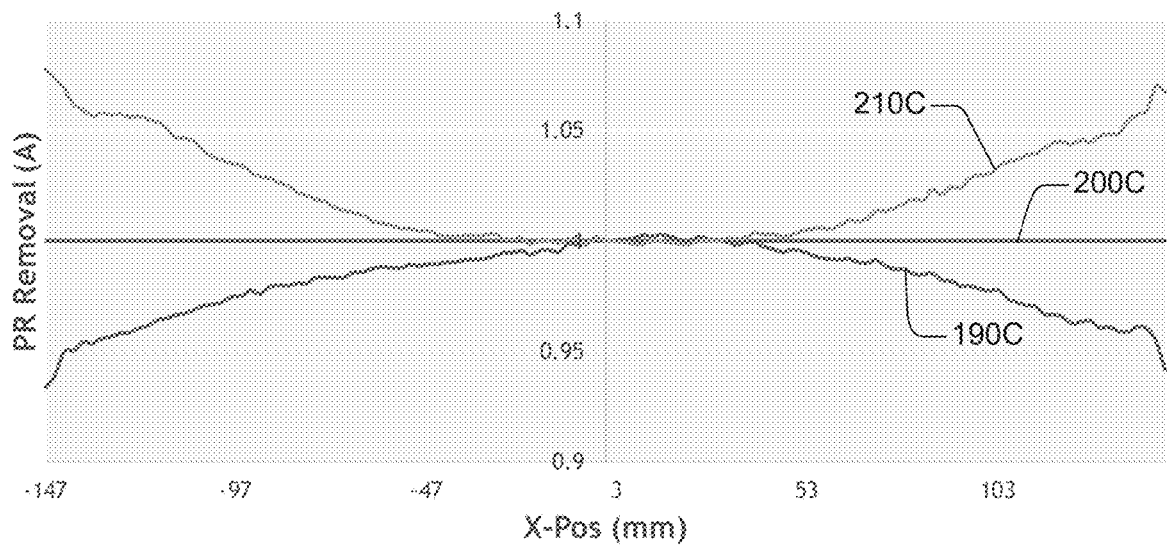

Referring now to FIGS. 8A and 8B, photoresist removal is shown as a function of a distance from center of the substrate. Different substrate temperatures produce different ash rates as shown in FIG. 8A. When normalized at 200° C., temperature-based tune-ability is demonstrated. The temperature tune-ability can be used to compensate for thickness variations in the incoming photoresist layers and/or variations in the treatment process such as the photoresist treatment process.

Figure 9:
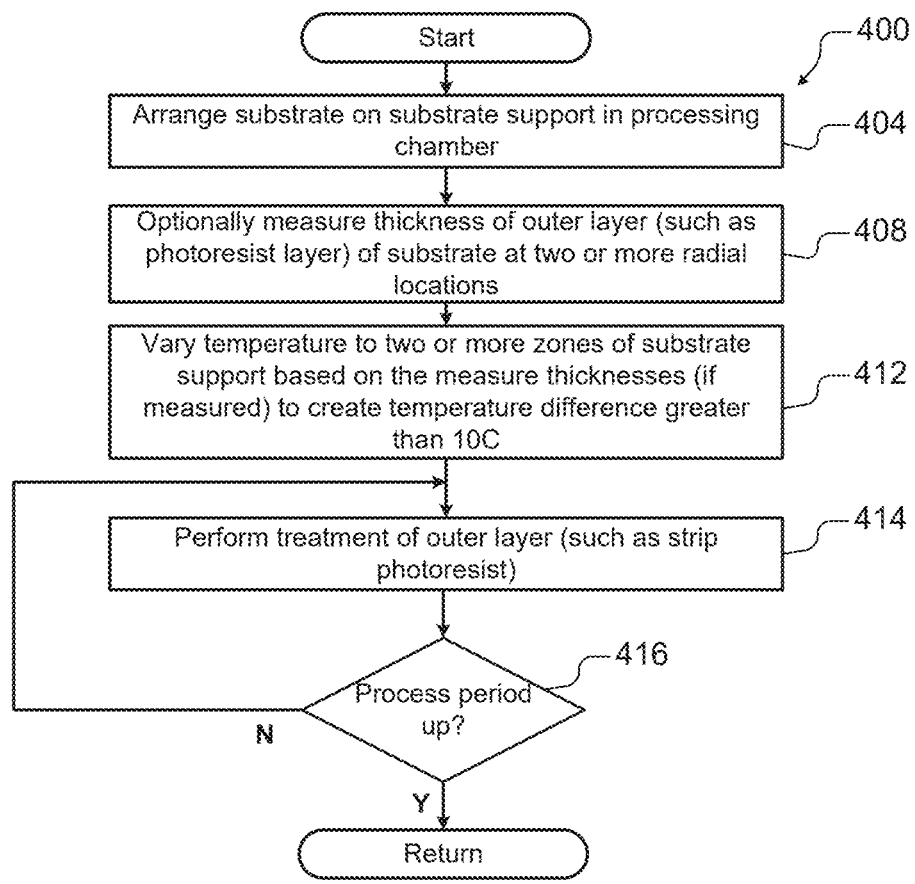
FIG. 9 is a flowchart illustrating steps for treating a substrate according to the present disclosure.

Referring now to FIG. 9, a method 400 for treating a substrate is shown. At 404, a substrate is arranged on the substrate support in the processing chamber. At 408, a thickness of various locations of an outer layer of the substrate can be measured. In some examples, the measurement may be made using an optical interference sensor. At 412, a temperature of the substrate support is varied to create a temperature difference that is greater than 10° C. In some examples, the temperature difference is based upon the measurements made at 408 or predetermined measurement estimates. At 414, treatment of the outer layer of the substrate is performed. In some examples, the treatment includes stripping a photoresist layer. At 416, the method determines whether the process period is up. When 416 is false, the method continues at 414. When 416 is true, the method returns.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for controlling a temperature of a substrate during treatment in a substrate processing system, comprising:
    a substrate support including:
        a first component including an upper surface at least partially defining a center zone;
        a second component that is arranged radially outside of and below the first component,
            wherein the first component and the second component are spaced apart and define a gap therebetween, and
            wherein the second component includes an upper surface at least partially defining a radially-outer zone;
        a plurality of height adjustment mechanisms configured to move the first component and to adjust a height of the first component relative to the second component to adjust the gap between the first component and the second component to alter an amount of heat coupling between the first component and the second component;
        a first heater configured to heat the first component;
        a second heater configured to heat the second component;
        a first heat sink having one end in thermal communication with the first component; and
        a second heat sink having one end in thermal communication with the second component.

2. The system of claim 1, wherein the substrate is held by gravity on the substrate support and is not held by mechanical clamping or an electrostatic chuck.

3. The system of claim 1, wherein the first component has a cone shape and the second component has an inverse cone shape.

4. The system of claim 1, wherein the second heat sink includes a bellows-type heat sink.

5. The system of claim 1, further comprising a plurality of spacers arranged in the center zone to provide a predetermined gap between the substrate and the substrate support during treatment.

6. The system of claim 1, wherein the substrate support includes a plurality of notches projecting radially inwardly from an outer edge of the substrate support.

7. The system of claim 1, further comprising a temperature-controlled thermal mass in thermal communication with other ends of the first heat sink and the second heat sink.

8. The system of claim 1, wherein at least one of the center zone and the radially-outer zone is maintained at a temperature in a range from 90° C. to 350° C. and wherein a temperature difference between the first component and the second component is in a range from 18° C. to 100° C.

9. The system of claim 1, wherein the treatment comprises photoresist ashing, at least one of the center zone and the radially-outer zone is maintained at a temperature in a range from 90° C. to 350° C. and wherein a temperature difference between the first component and the second component is in a range from 18° C. to 100° C.

10. The system of claim 1, wherein a temperature difference between the first component and the second component is in a range from than 10° C. to 100° C. during the treatment.

11. The system of claim 1 wherein each of the height adjustment mechanisms comprises a ball arranged in a slot in a bottom surface of the first component and a height adjustment device arranged in a cavity formed in the second component.

12. The system of claim 1 wherein the second component includes a lower portion that extends radially and downwardly sloping inward and that partially surrounds an outer lower portion of the first component and includes an upper portion that extends axially upwards and that surrounds a radially-outer edge of the first component.

* * * * *